(12) United States Patent
Ishibashi

(10) Patent No.: US 9,349,612 B2
(45) Date of Patent: May 24, 2016

(54) LEAD FRAME

(71) Applicant: MITSUI HIGH-TEC , INC., Fukuoka (JP)

(72) Inventor: Takahiro Ishibashi, Fukuoka (JP)

(73) Assignee: MITSUI HIGH-TEC, INC., Fukuoka (JP)

( * ) Notice: Subject to any disclaimer, the term of this patent is extended or adjusted under 35 U.S.C. 154(b) by 4 days.

(21) Appl. No.: 14/146,310

(22) Filed: Jan. 2, 2014

(65) Prior Publication Data

US 2014/0196938 A1  Jul. 17, 2014

(30) Foreign Application Priority Data

Jan. 11, 2013  (JP) .................................. 2013-003110

(51) Int. Cl.
| | |
|---|---|
| *H05K 1/03* | (2006.01) |
| *H05K 1/18* | (2006.01) |
| *H05K 3/00* | (2006.01) |
| *H01L 23/495* | (2006.01) |
| *H01L 21/56* | (2006.01) |
| *H01L 23/00* | (2006.01) |
| *H01L 23/31* | (2006.01) |

(52) U.S. Cl.
CPC ........ *H01L 21/561* (2013.01); *H01L 23/49541* (2013.01); *H01L 23/49562* (2013.01); *H01L 24/97* (2013.01); *H05K 1/18* (2013.01); *H05K 1/181* (2013.01); *H05K 3/0052* (2013.01); *H01L 23/3107* (2013.01); *H01L 24/32* (2013.01); *H01L 24/48* (2013.01); *H01L 24/73* (2013.01); *H01L 2224/32245* (2013.01); *H01L 2224/48091* (2013.01); *H01L 2224/48247* (2013.01); *H01L 2224/73265* (2013.01); *H01L 2224/97* (2013.01)

(58) Field of Classification Search
CPC ................... H01L 23/49586; H01L 23/49537; H01L 21/561; H01L 24/97; H01L 23/49541; H01L 23/49562; H01L 2224/4809; H01L 24/32; H01L 2224/97; H01L 24/48; H01L 2224/32245; H01L 2224/73265; H01L 24/73; H01L 2224/48247; H01L 23/3107; H01L 2224/48
USPC ................... 174/250–268; 257/666, 676, 692
See application file for complete search history.

(56) References Cited

U.S. PATENT DOCUMENTS

| | | | | |
|---|---|---|---|---|
| 7,259,460 | B1 * | 8/2007 | Bayan et al. ................... | 257/728 |
| 7,608,482 | B1 * | 10/2009 | Bayan ............................ | 438/112 |
| 2006/0033184 | A1 * | 2/2006 | Park et al. ..................... | 257/666 |
| 2012/0009737 | A1 * | 1/2012 | Kuratomi et al. ............. | 438/112 |

FOREIGN PATENT DOCUMENTS

JP  2005-166695  6/2005

OTHER PUBLICATIONS

U.S. Appl. No. 14/146,201 to Takahiro Ishibashi, filed Jan. 2, 2014.

* cited by examiner

*Primary Examiner* — Ishwarbhai B Patel
(74) *Attorney, Agent, or Firm* — Greenblum & Bernstein, P.L.C.

(57) ABSTRACT

A lead frame includes a plurality of unit lead frames arranged in a matrix. Leads of adjacent ones of the unit lead frames are connected via a connecting bar, in which a longitudinal connecting bar and a transverse connecting bar are crossed at a crossing part. The lead frame further includes a dicing part including the connecting bar and a part of the leads, to be cut along a dicing line, a half-etching part formed along the dicing part, and being smaller in width than the dicing part, and a strength retention part formed in the half-etching part and extended from the crossing part of the connecting bar at least to an end lead located closest to the crossing part among the leads of the unit lead frame adjacent to the crossing part.

6 Claims, 4 Drawing Sheets

LEAD FRAME

CROSS-REFERENCE TO RELATED APPLICATIONS

This application is based upon and claims the benefit of priority of Japanese Patent Application No. 2013-003110 filed on Jan. 11, 2013, the contents of which are incorporated herein by reference in its entirety.

BACKGROUND OF THE INVENTION

1. Field of the Invention

The present invention relates to a lead frame used for a semiconductor apparatus, especially for a QFN (Quad Flat Non-Leaded) semiconductor apparatus which is manufactured using a MAP (Molded Array Process) mold-forming technique in which a plurality of semiconductor apparatuses are collectively sealed with resin.

2. Description of the Related Art

A QFN semiconductor apparatus is manufactured by using the MAP mold-forming technique which seals a plurality of semiconductor apparatuses with resin collectively. First, a lead frame in which a plurality of lead parts of adjacent unit lead frames are interconnected via a connecting bar is prepared as a MAP lead frame. A semiconductor device is bonded on a mounting part of the lead frame, and the semiconductor device and leads of the lead frame are connected via wires. Then, the lead frame, the semiconductor device and the wires are sealed with resin. Subsequently, the connecting bar (also referred to as a dam bar) is removed by dicing, thereby splitting into individual unit lead frames.

If the thickness of the connecting bar is large, a load to a rotary blade is increased when performing the dicing, thereby accelerating galling of the rotary blade. Thus, a dicing capability is deteriorated and cutting burr may be produced.

JP-A-2005-166695 describes a technique for performing half-etching from a rear side on the whole of the dam bar except for a rear side of a device mounting part and a rear-side terminal part of the lead. In this way, it is possible to suppress the acceleration of galling of the rotary blade when performing the dicing, and prevent the cutting burr from being produced.

SUMMARY OF THE INVENTION

In recent years, a semiconductor apparatus grows in size due to the increase of pins and a lead frame is thinned in conformity with thinning the semiconductor apparatus. On the other hand, a lead frame tends to be larger in area in order to increase the number of unit lead frames obtained from each piece of lead frames. Accordingly, in a structure in which the whole of the connecting bar is thinned as described in JP-A-2005-166695, a problem is raised that the connecting bar, which serves as a connection of the unit lead frames, and its neighboring parts cannot be tolerant to an external force, thereby being deformed. The connecting bar is arranged to surround the unit lead frame and includes a crossing point at which a longitudinal connecting bar and a transverse connecting bar are crossed. The unit lead frame includes a plurality of leads which is divided into four lead-groups. The connecting bar is deformed, especially between the crossing point and the lead-groups.

JP-A-2005-166695 describes a technique by which a dam bar of a lead frame is thinned by half-etching and a part thicker than a thinned portion is formed on the dam bar along the direction of dicing. In this technique, it is possible to prevent the cutting burr from being produce when performing dicing while securing the strength of the dam bar. In this method, however, although the strength of the dam bar is secured, since the thicker part is formed consecutively to the dam bar, a problem is raised that the cutting burr may be produced because the load to the rotary blade cannot be sufficiently lowered when performing dicing. In addition, an etching process becomes difficult because an etching solution is hardly infiltrated into a portion to be etched which is provided between the lead and the portion thicker than the thinned portion.

The present invention has been made in consideration with the above circumstance, and an object of the present invention is to provide a lead frame having a connecting bar, the shape of which can be formed with simple etching process, so as to suppress the production of cutting burr in dicing and to prevent a periphery of a crossing point of connecting bars from being deformed.

A first aspect of the present invention provides a lead frame, including: a plurality of unit lead frames arranged in a matrix; a plurality of leads aligned along sides of each of the plurality of unit lead frames, a rear surface of the leads being exposed; a connecting bar via which the leads of adjacent ones of the plurality of unit lead frames are connected, the connecting bar including a longitudinal connecting bar, a transverse connecting bar and a crossing part at which the longitudinal connecting bar and the transverse connecting bar are crossed; a dicing part including the connecting bar and a part of the leads, to be cut along a dicing line; a half-etching part formed along the dicing part, and being smaller in width than the dicing part; and a strength retention part formed in the half-etching part and extended from the crossing part of the connecting bar at least to an end lead located closest to the crossing part among the leads of the unit lead frame adjacent to the crossing part.

According to a second aspect of the present invention, the lead frame may be configured so that the strength retention part includes a first strength retention part formed along a dicing direction of the connecting bar and a second strength retention part formed along the leads, and the second strength retention part is formed between a pair of leads connected to each other via the connecting bar.

According to a third aspect of the present invention, the lead frame may be configured so that the first strength retention part is formed consecutively to the second strength retention part.

According to a fourth aspect of the present invention, the lead frame may be configured so that the first strength retention part has a quarter to half width of the connecting bar.

According to a fifth aspect of the present invention, the lead frame may be configured so that the second strength retention part has a quarter to half width of the connecting bar According to a sixth aspect of the present invention, the lead frame may be configured so that a distance between an end of the half-etching part at a side of the first strength retention part and an end of the half-etching part at a side of the lead is 0.5 to 0.75 times larger than a width of the connecting bar.

According to the lead frame as mentioned above, the thickness of metal of the dicing part to be cut with the rotary blade is thinned. Since a load to the rotary blade applied when performing dicing is reduced, production of cutting burr is suppressed and a life of the rotary blade is prolonged. Further, since the strength retention part is formed in the half-etching part and extended from the crossing part of the connecting bar to the end lead located closest to the crossing part among the leads of the unit lead frame adjacent to the crossing part, it is possible to enhance the strength on a part on which a stress is most likely concentrated. Thus, it is unnecessary more than necessary to increase the thickness of the metal in the dicing part, and the lead frame is prevented from being deformed. In addition, since the strength of the lead frame is increased, it is harmonized with growing in size of the semiconductor apparatus and the thinning of the lead frame. In addition, since the strength retention part includes the first strength retention part and the second strength retention part, the connecting bar is tolerant to a stress applied from multi-directions, and moreover, etching process becomes simple for a part between the first strength retention part and a widthwise end of the half-etching part of the lead.

DETAILED DESCRIPTION OF THE EXEMPLARY EMBODIMENTS

A lead frame according to exemplary embodiments of the present invention will be described in detail with reference to the accompanying drawings.

Figure 1:
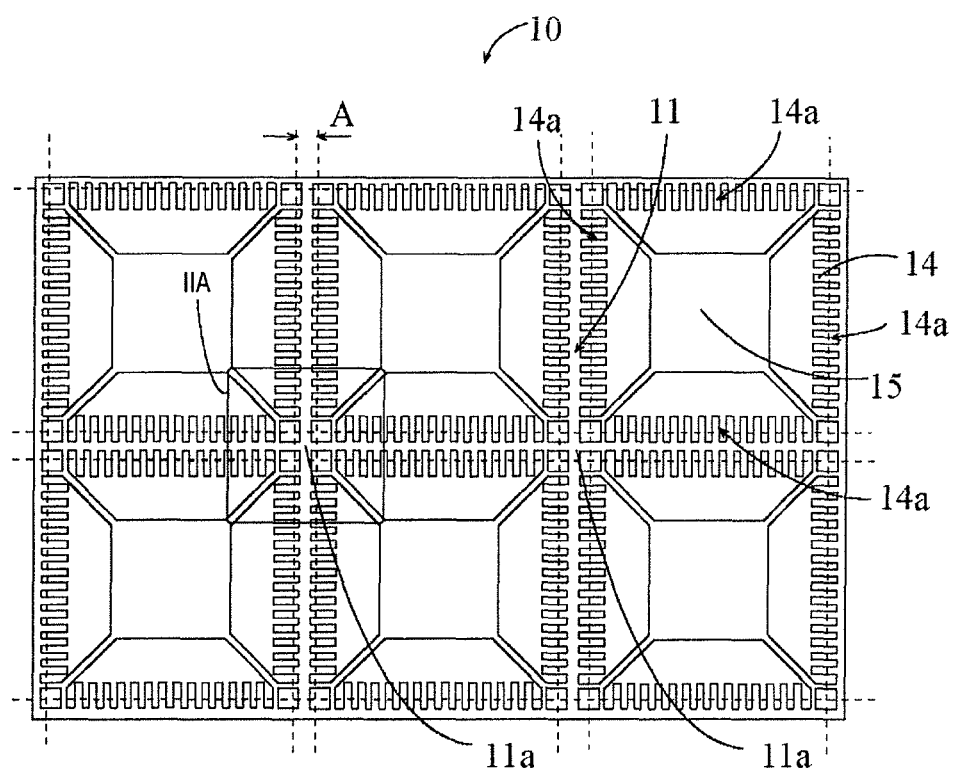
FIG. 1 is a plan view of a lead frame according to a first embodiment of the present invention.
Figure 3:
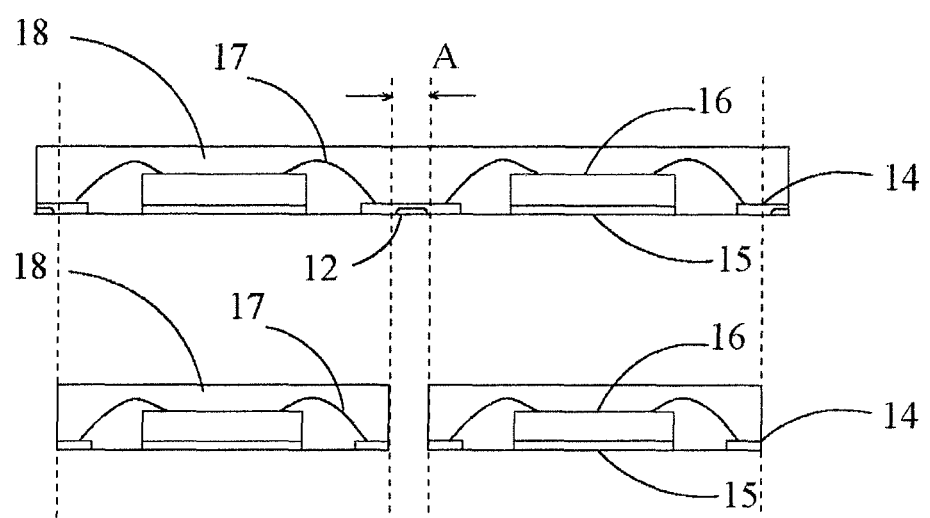
FIG. 3 shows a dicing process of the lead frame according to the first embodiment of the present invention.

FIG. 1 is a schematic plan view of a lead frame 10 according to a first embodiment of the present invention. The lead frame 10 includes a plurality of unit lead frames arranged in a matrix. Each unit lead frame includes a mounting part 15 on which a semiconductor device 16 is mounted. The unit lead frame includes a plurality of leads 14, being divided into four lead groups 14a aligned along each side of the unit lead frame. The leads 14 of adjacent unit lead frames are connected via a connecting bar 11. The connecting bar 11 includes a longitudinal connecting bar and a transverse connecting bar. The longitudinal connecting bar and the transverse connecting bar cross each other at a crossing part 11a. A dashed line indicates a dicing line to be cut with a rotary blade after one surface of the lead frame 10 is sealed with resin 18 as shown in FIG. 3. A part between the dicing lines indicates a dicing part to be cut in a dicing process.

Figure 2A:
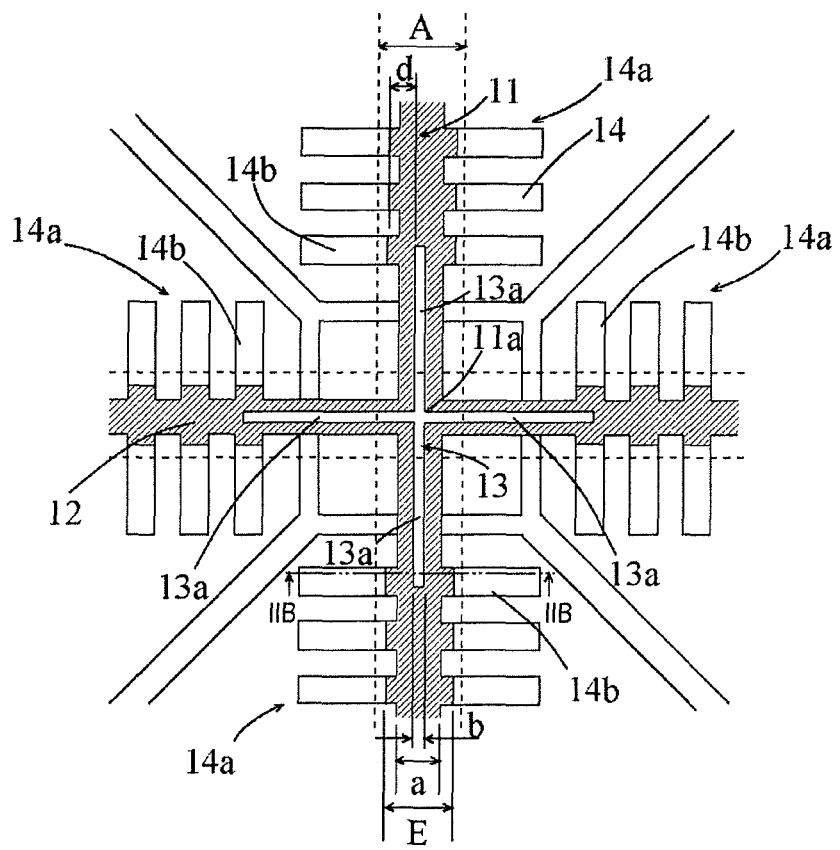
FIG. 2A is a plan view showing a rear side in a periphery of a crossing part of a connecting bar of the lead frame according to the first embodiment of the present invention.
Figure 2B:
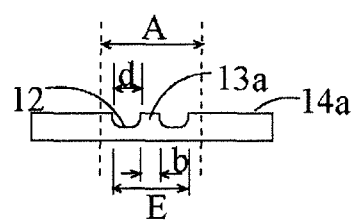
FIG. 2B is a cross-sectional view taken along a line IIB-IIB in FIG. 2A.

FIG. 2A is an enlarged plan view in a periphery of a crossing part 11a of a connecting bar 11 within a width A of the dicing part at a rear side of the lead frame 10, as indicated by reference sign IIA in FIG. 1. FIG. 2B is an enlarged cross-sectional view in a periphery of the connecting bar 11 to show a cross-section taken along a line IIB-IIB in FIG. 2A. In FIG. 2A, a half-etching part 12 is hatched for the sake of easy identification.

FIG. 3 is a cross-sectional view of a semiconductor apparatus which uses the lead frame 10 according to the first embodiment of the present invention.

In the lead frame 10, a half-etching part 12 is formed along the dicing part. In addition, a strength retention part 13 is formed in the half-etching part 12 and extended from the crossing part 11a of the connecting bar 11 to an end lead 14b located closest to the crossing part 11a among the lead group 14a adjacent to the crossing part 11a. A width E of the half-etching part 12 is smaller than a width A of the dicing part. According to the existence of the half-etching part 12, since a load to the rotary blade applied when performing dicing is reduced, production of cutting burr is suppressed and a life of the rotary blade is prolonged. If the width E of the half-etching part 12 is larger than the width A of the dicing part, the half-etching part 12 cannot be cut sufficiently in dicing. Thus, the exposed area of the leads is reduced and the solderability is deteriorated. According to the first embodiment of the present invention, since the width E of the half-etching part 12 is formed to be smaller than the width A of the dicing part, the half-etching part 12 is wholly cut in dicing, and the leads 14 are exposed over a mounting surface of the semiconductor apparatus and their side surfaces, as shown in FIG. 3. Accordingly, when soldering process is performed, the solder is applied to the side surface of the lead 14, and the solderability is improved.

Since the strength retention part 13 is formed in the half-etching part 12 and extended from the crossing part 11a of the connecting bar 11 to the end lead 14b located closest to the crossing part 11a among the lead group 14a adjacent to the crossing part 11a, it is possible to enhance the strength on a part on which a stress is most likely concentrated. Thus, it is unnecessary more than necessary to increase the thickness of the metal in the dicing part, and the lead frame 10 is prevented from being deformed. The strength retention part 13 includes a first strength retention part 13a formed along a dicing direction of the connecting bar 11.

Here, where a width of the connecting bar 11 is defined as a, a width of the first strength retention part 13a is defined as b, a distance between an end of the half-etching part 12 at a side of the first strength retention part 13a and an end of the half-etching part 12 at a side of the lead 14a is defined as d, this embodiment shows an example of a=0.1 mm, b=0.05 mm and d=0.075 mm. It could be applicable if b is 0.25 to 0.5 times larger than a, and d is 0.50 to 0.75 times larger than a.

If the parameter b falls below a lower limit value or the parameter d exceeds an upper limit value, that is, if the strength retention part 13 becomes thin or the half-etching part 12 is broadened, it is possible that the strength retention part 13 is partly dropped out due to the variation in dicing, and therefore the strength of the lead frame 10 is not secured. In addition, if the parameter b exceeds an upper limit value or the parameter d falls below a lower limit value, that is, if the strength retention part 13 becomes thick or the half-etching part 12 is narrowed, it becomes not possible to prevent the cutting burr from being produced.

As shown in FIG. 3, the semiconductor device 16 is mounted on the mounting part 15 of each unit lead frame of the lead frame 10. The leads 14 and the semiconductor device 16 are connected via wires 17. Then, one surface of the lead frame 10 including the semiconductor device 16 and the wires 17 are sealed with the resin 18. The dicing part is cut with the rotary blade along the dicing lines, thereby splitting the lead frame 10 into individual unit lead frames.

Figure 4A:
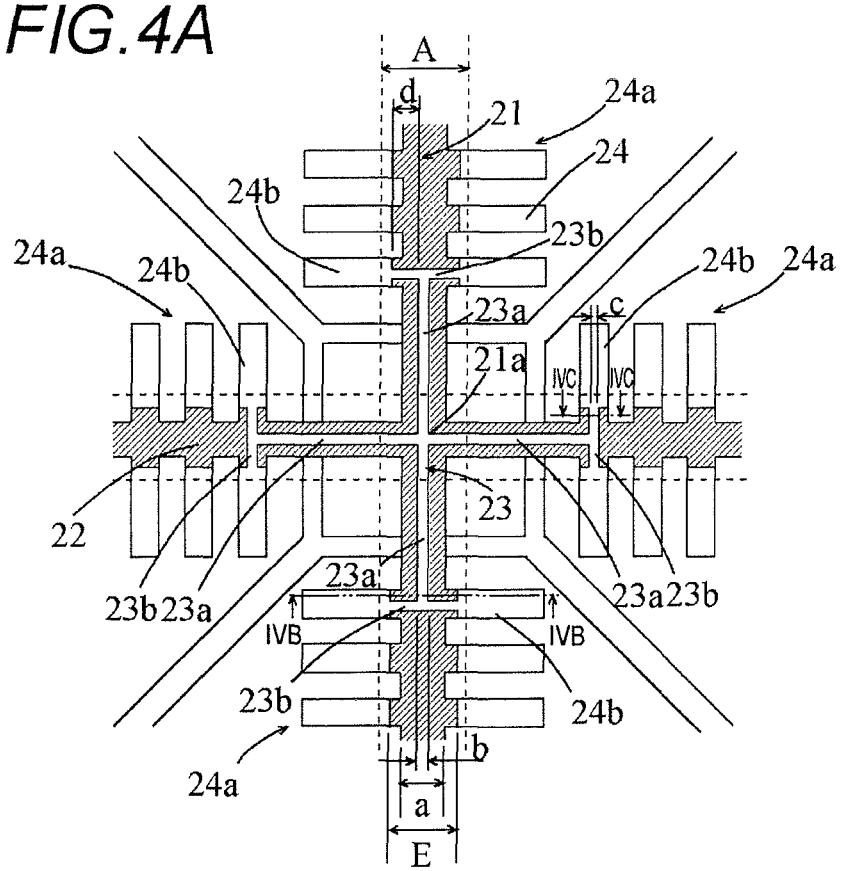
FIG. 4A is a plan view showing a rear side in a periphery of a crossing point of connecting bars of a lead frame according to a second embodiment of the present invention.
Figure 4B:
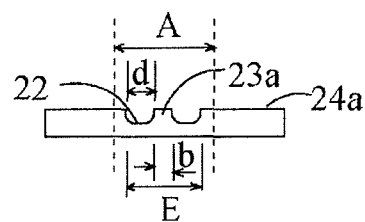
FIG. 4B is a cross-sectional view taken along a line IVB-IVB in FIG. 4A.
Figure 4C:
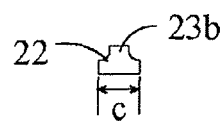
FIG. 4C is a cross-sectional view taken along a line IVC-IVC in FIG. 4A.

Subsequently, a lead frame according to a second embodiment of the present invention will be described, especially for points different from the lead frame according to the first embodiment. FIG. 4A is an enlarged plan view in a periphery of a crossing part 21a of a connecting bar 21 within a width A of the dicing part at a rear side of the lead frame 10. FIG. 4B is an enlarged cross-sectional view in a periphery of the connecting bar 21 to show a cross-section taken along a line VIB-VIB in FIG. 4A. FIG. 4C is an enlarged cross-sectional view of the connecting bar 21 to show a cross-section taken along a line VIC-VIC in FIG. 4A.

A strength retention part 23 is formed in a half-etching part 22 and extended from a crossing part 21a of the connecting bar 21 to an end lead 24b located closest to the crossing part 21a among the lead group 24a adjacent to the crossing part 21a. The strength retention part 23 includes a first strength retention part 23a formed along a dicing direction of the connecting bar 21 and a second strength retention part 23b formed along the lead 24b. The first strength retention part 23a is formed consecutively to the second strength retention part 23b. As shown in FIG. 4A, the second strength retention part 23b is formed between a pair of closest leads 24b located closest to the crossing part 21a among the lead groups 24 adjacently connected via the connecting bar 21. Since the second strength retention part 23b is formed, the connecting bar is tolerant to a stress applied from multi-directions. In addition, since the single second strength retention part 23b is formed between the pair of leads 24b, it is unnecessary to etch a portion between the first strength retention part 23a and the lead 24b into which an etching solution is hardly infiltrated, and half-etching process is performed only on a portion into which an etching solution is easily infiltrated. Thus, etching process becomes simple.

Here, where a width of the connecting bar 21 is defined as a, a width of the first strength retention part 23a is defined as b, a width of the second strength retention part 23b is defined as c, a distance between an end of the half-etching part 22 at a side of the first strength retention part 23a and an end of the half-etching part 22 at a side of the lead 24a is defined as d, this embodiment shows an example of a=0.1 mm, b=0.05 mm, c=0.05 mm and d=0.075 mm. It could be applicable if b and c are 0.25 to 0.5 times larger than a, and d is 0.50 to 0.75 times larger than a.

If the parameter b or c falls below a lower limit value or the parameter d exceeds an upper limit value, that is, if the strength retention part 23 becomes thin or the half-etching part 22 is broadened, it is possible that the strength retention part 23 is partly dropped out due to the variation in dicing, and therefore the strength of the lead frame 10 is not secured. In addition, if the parameter b or c exceeds an upper limit value or the parameter d falls below a lower limit value, that is, if the strength retention part 23 becomes thick or the half-etching part 22 is narrowed, it becomes not possible to prevent the cutting burr from being produced.

The present invention has been explained in detail with reference to the particular exemplary embodiments. However, the present invention is not limited to the configuration as described in those embodiments, but contains other embodiments, various variations and modifications possibly considered in the scope of the present invention.

What is claimed is:

1. A lead frame, comprising:
   a plurality of unit lead frames arranged in a matrix;
   a plurality of leads aligned along sides of each of the plurality of unit lead frames, a rear surface of the leads being exposed;
   a connecting bar via which the leads of adjacent ones of the plurality of unit lead frames are connected, the connecting bar including a longitudinal connecting bar, a transverse connecting bar, and a crossing part at which the longitudinal connecting bar and the transverse connecting bar cross each other;
   a dicing part including the connecting bar and a part of the leads, to be cut along a dicing line;
   a half-etching part formed along the dicing part, and being smaller in width than the dicing part;
   wherein each of the surrounding leads that are closest to the crossing part and provided on either side of both the longitudinal connecting bar and the transverse connecting bar, together, defines an outermost boundary of a strengthened region; and
   a strength retention part formed in the half-etching part and extended from the crossing part so as to be positioned entirely within the strengthened region.

2. The lead frame according to claim 1, wherein the strength retention part includes a first strength retention part formed along a dicing direction of the connecting bar and a second strength retention part formed along the surrounding leads that are closest to the crossing part, and the second strength retention part is formed between a pair of leads connected to each other via the connecting bar.

3. The lead frame according to claim 2, wherein the first strength retention part is formed consecutively to the second strength retention part.

4. The lead frame according to claim 2, wherein the first strength retention part has a quarter to half width of the connecting bar.

5. The lead frame according to claim 2, wherein the second strength retention part has a quarter to half width of the connecting bar.

6. The lead frame according to claim 2, wherein a distance between an end of the half-etching part at a side of the first strength retention part and an end of the half-etching part at a side of the lead is 0.5 to 0.75 times larger than a width of the connecting bar.

\* \* \* \* \*